United States Patent
Ezaki

(10) Patent No.: US 7,318,746 B2
(45) Date of Patent: Jan. 15, 2008

(54) CARD SOCKET ASSEMBLY

(75) Inventor: Masakazu Ezaki, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 15 days.

(21) Appl. No.: 11/412,142

(22) Filed: Apr. 27, 2006

(65) Prior Publication Data

US 2006/0250757 A1    Nov. 9, 2006

(30) Foreign Application Priority Data

May 9, 2005    (JP) ............................. 2005-135844

(51) Int. Cl.
*H01R 13/635* (2006.01)
(52) U.S. Cl. .................... 439/541.5; 439/607
(58) Field of Classification Search ............ 439/541.5, 439/64, 630, 607
See application file for complete search history.

(56) References Cited

U.S. PATENT DOCUMENTS

| | | | | |
|---|---|---|---|---|
| 5,591,047 A | * | 1/1997 | Yamada et al. .......... | 439/541.5 |
| 6,059,586 A | * | 5/2000 | Watanabe et al. .......... | 439/159 |
| 6,116,950 A | * | 9/2000 | Koseki .................... | 439/541.5 |
| 6,174,197 B1 | * | 1/2001 | Hirata et al. ............. | 439/541.5 |
| 6,193,547 B1 | * | 2/2001 | Tung ....................... | 439/541.5 |
| 6,231,382 B1 | * | 5/2001 | Yu .......................... | 439/541.5 |
| 6,554,641 B1 | * | 4/2003 | Wu ......................... | 439/541.5 |
| 6,648,680 B1 | * | 11/2003 | Hu .......................... | 439/541.5 |
| 7,018,234 B2 | * | 3/2006 | Tanigawa et al. ......... | 439/541.5 |

FOREIGN PATENT DOCUMENTS

JP    9-82407    3/1997

* cited by examiner

*Primary Examiner*—Hien Vu
(74) *Attorney, Agent, or Firm*—Takeuchi & Kubotera, LLP

(57) ABSTRACT

A card socket assembly includes a plurality of sockets situated in multiple stages for receiving cards and a pair of fixing members disposed at both sides of the sockets for fixing the sockets to a circuit board. Each of the fixing members includes a fixing portion to be fixed to the circuit board and a holding portion for holding the socket. The holding portion of one of the fixing members includes a first holding member for holding all of the sockets. The holding portion of the other of the fixing members includes a second holding member for holding one of the sockets and an elastic holding member for holding the others of the sockets separately and elastically.

8 Claims, 4 Drawing Sheets

CARD SOCKET ASSEMBLY

BACKGROUND OF THE INVENTION AND RELATED ART STATEMENT

The present invention relates to a card socket assembly.

An electric device, especially a personal computer, is provided with a socket for receiving a card such as a PC card to expand functionality. Such a socket corresponds to a specific card, and a plurality of sockets is supported integrally with a bracket to form a card socket assembly.

Patent Reference has disclosed brackets for supporting two sockets for receiving cards. The brackets are formed of metal, and are situated at left and right sides of the sockets. Each of the brackets includes a fixing portion contacting with a circuit board and a holding portion contacting with a side of the socket. The fixing portion and the holding portion are bent to have an L shape cross-section.

In the bracket disclosed in Patent Reference, the holding portion has an opening portion, so that an engaging portion with a tongue shape provided on the socket slides and engages an edge of the opening portion. In this state, the fixing portion is fixed to the circuit board with a screw. Accordingly, the two sockets are supported with the brackets at both sides thereof, and fixed to the circuit board simultaneously.

Patent Reference: Japanese Patent Publication No. 09-82407

In Patent Reference, when the brackets are fixed to the circuit board, the holding portions of the brackets are automatically situated at specific positions relative to the sockets. Accordingly, if the sockets or the brackets have a dimensional variance, it is possible that an excessive stress or a deformation may occur in the fixing portion or the holding portion.

Such a dimensional variance includes a variance in a width of one of the brackets relative to the other thereof, and an angler variance from the exact right angle in an angle between the holding portion and the fixing portion of the bracket formed in an L shape. When the sockets or the brackets have such a dimensional variance, it is necessary to forcibly fit the sockets into the brackets, thereby generating an excessive stress. As a result, the sockets or the brackets may be damaged or deformed through fatigue. When the sockets or the brackets are greatly deformed, it is difficult to smoothly insert a card into the socket.

In view of the problems described above, an object of the present invention is to provide a card socket assembly, in which it is possible to prevent an excessive stress and smoothly insert a card into a socket even when the socket has a dimensional variance or a positional variance upon assembling.

Further objects of the present invention will be apparent from the following description of the invention.

SUMMARY OF THE INVENTION

According to the present invention, a card socket assembly includes a plurality of sockets situated in multiple stages for receiving cards and a pair of fixing members disposed at both sides of the sockets for fixing the sockets to a circuit board. Each of the fixing members includes a fixing portion to be fixed to the circuit board and a holding portion for holding the socket. The holding portion of one of the fixing members includes a first holding member for holding all of the sockets. The holding portion of the other of the fixing members includes a second holding member for holding one of the sockets and an elastic holding member for holding the others of the sockets separately and elastically.

In the card socket assembly of the present invention, the sockets are fixedly supported at one side portions thereof with the first holding member. The one of the sockets is fixedly supported at the other side portion thereof with the second holding member. The others of the sockets are elastically and separately supported at the other side portions thereof with the elastic holding member. Accordingly, it is possible to absorb a dimensional variance or a positional variance of the sockets.

According to the present invention, the fixing member may have a fixing portion and a holding portion having an L shape cross-section. The elastic holding member may have a spring member for urging a side of the socket and a regulation member for regulating a position of the socket in a direction that the socket is urged.

According to the present invention, the holding portion of the other of the fixing members may have an elastic holding member having a base surface shifted relative to a base surface of the second holding member. With this configuration, it is possible to deal with an inherent dimensional variance of the socket in addition to a dimensional variance and a positional variance thereof. Especially when the elastic holding member has a base surface shifted away from the side surface of the socket, it is possible to elastically hold a large socket, and to secure a large allowance relative to a dimensional variance and a positional variance even when the sockets have an identical standard dimension.

According to the present invention, one of the fixing members may be arranged such that the one of the fixing members is situated away from the side portion of the socket with a space in between, so that a rod is accommodated in the space for operating a card ejection mechanism, thereby utilizing a space efficiently.

As described above, in the present invention, one of the fixing members fixedly holds the one side portions of the sockets, and the other of the fixing members holds, except one of the sockets, the others of the sockets separately and elastically. Accordingly, it is possible to stably hold the socket and absorb a dimensional variance and a positional variance of the sockets and other components to deal with various sizes of the sockets and the fixing members without generating an excessive stress. Therefore, it is possible to smoothly insert a card without excessive deformation.

DETAILED DESCRIPTION OF THE PREFERRED EMBODIMENTS

Hereunder, embodiments of the present invention will be explained with reference to the accompanying drawings.

Figure 1:
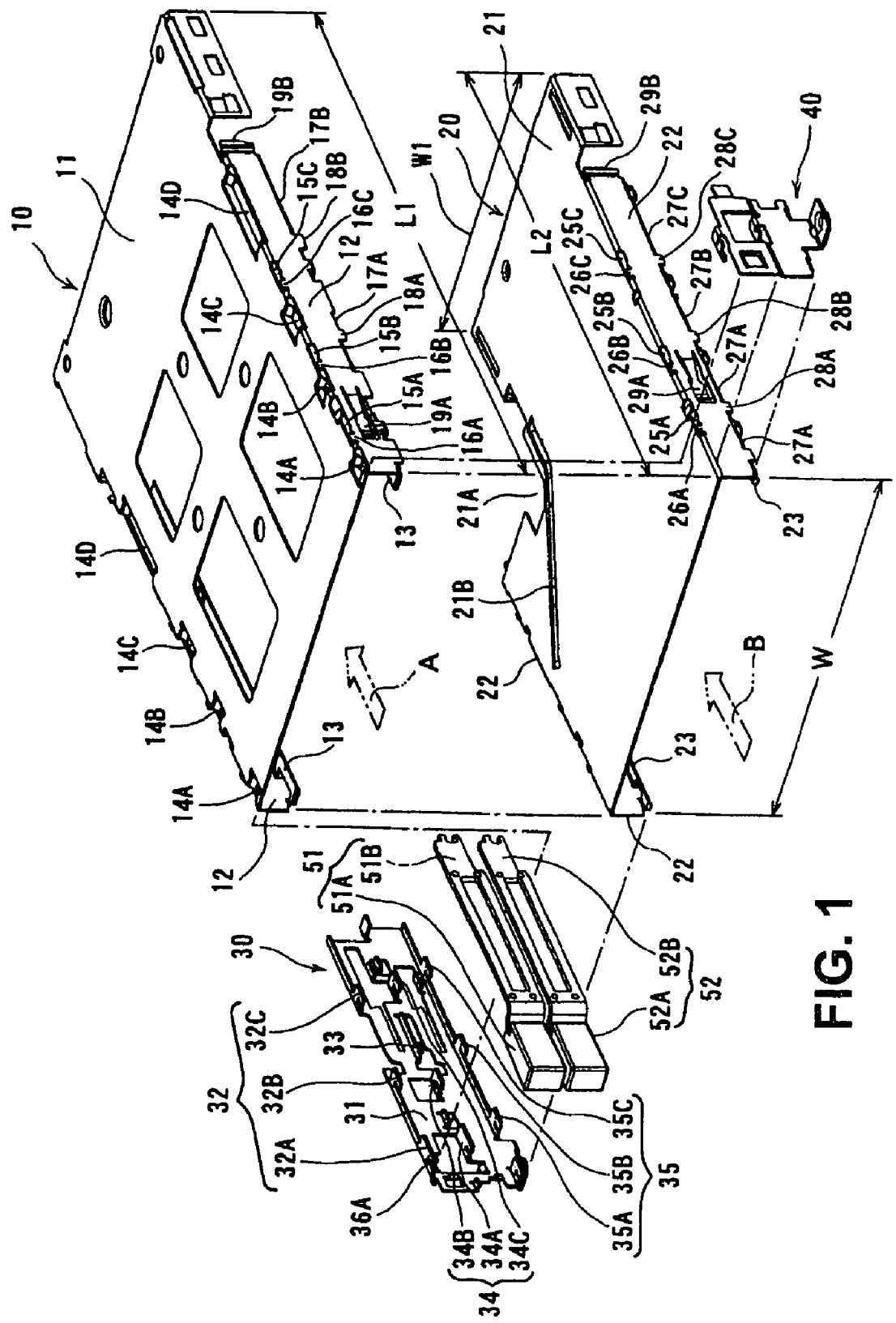
FIG. 1 is a perspective view showing a card socket assembly in an exploded state according to an embodiment of the present invention.

FIG. 1 is an exploded perspective view showing a card socket assembly according to an embodiment of the present invention.

As shown in FIG. 1, a PC card socket 10 is situated at an upper stage, and an express card socket 20 is situated at a lower stage. The upper socket 10 and the lower socket 20 have inner dimensions corresponding to a PC card and an express card to be inserted from arrow directions A and B, respectively. That is, the upper socket 10 and the lower socket 20 have a same inner dimension W in a width direction as a card inlet, and different inner dimensions L1 and L2 in the arrow directions A and B, respectively. The inner dimension L1 is larger than the inner dimension L2.

The upper socket 10 is manufactured by punching and bending a metal plate, and has a symmetrical shape in a left-to-right direction relative to a center line extending in the arrow direction A. In the upper socket 10, side plate portions 12 extend from both side edges of an upper plate portion 11, and lower edge portions 13 extend inwardly from lower edges of the side plate portions 12 to hold a card.

Guide portions 14A, 14b, 14C, and 14D are formed in transition portions between the upper plate portion 11 and the side plate portions 12 of the upper socket 10 as cut portions cut in the upper plate portion 11 and bent downwardly. The guide portion 14D has a length larger than those of the guide portions 14A, 14B, and 14C. The guide portions 14A to 14D guide upper side surfaces of a PC card with bottom surfaces thereof.

Figure 3:
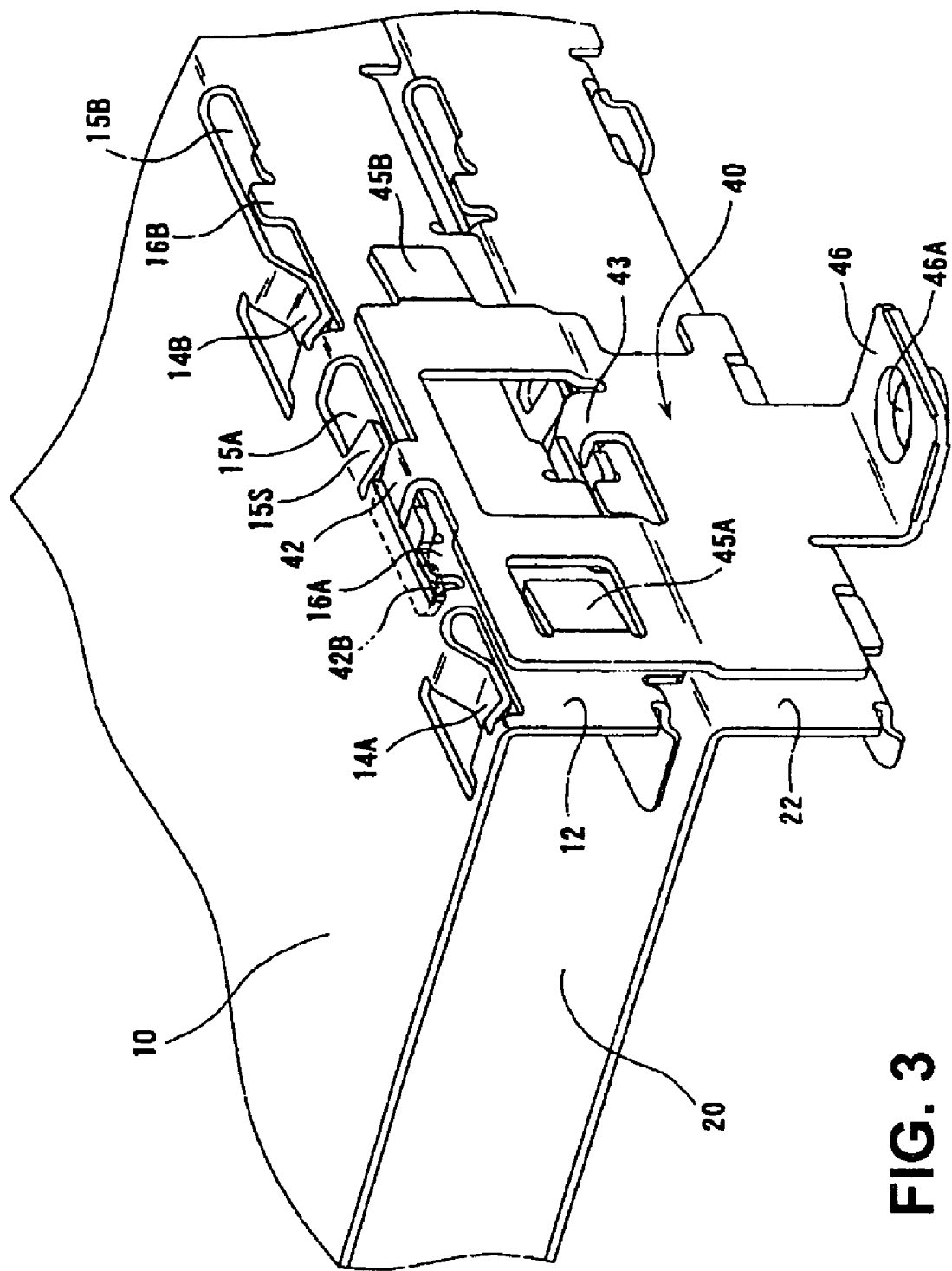
FIG. 3 is a perspective view showing another of the fixing members holding sockets.

Opening portions 15A, 15B, and 15C are formed at front sides of the guide portions 14A, 14B, and 14C along the arrow direction A. Engaging prices 16A, 16B, and 16C extending upwardly from lower edges of the opening portions 15A to 15C are formed at rear sides of the opening portions 15A to 15C. Two of the guide portions 14A and 14B, the opening portions 15A and 15B, and the engaging pieces 16A and 16B are shown in FIG. 3.

In the embodiment, when holding pieces of fixing members (described later) move in a direction opposite to the arrow direction A after the holding pieces are inserted sideways into the opening portions 15B and 15C, it is arranged such that the engaging pieces 16B and 16C are pressed into engaging grooves formed in the holding pieces of the fixing members, and the engaging pieces 16A elastically engage the holding pieces.

Similar to the opening portions 15A and 15B and the engaging pieces 16A and 16B, opening portions 17A and 17B and engaging pieces 18A and 18B are formed in transition portions between the side plate portions 12 and the lower edge portions 13 of the upper socket 10. Spring portions 19A and 19B are formed in the side plate portions 12 of the upper socket 10 as partial cut portions extending in the arrow direction A for urging a side portion of a card.

The lower socket 20 is provided for receiving an express card. Similar to the upper socket 10, the lower socket 20 is manufactured by punching and bending a metal plate. In the lower socket 20, side plate portions 22 extend from both side edges of an upper plate portion 21, and lower edge portions 23 extend inwardly from lower edges of the side plate portions 22 to hold a card.

In the lower socket 20, a front portion thereof in the arrow direction B has a width W1 and a cut portion 21A at a left side thereof, and a rear portion thereof has a width W same as that of the upper socket 10. An express card to be inserted into the lower socket 20 has a front portion having a width same as the width W1. When an express card is inserted into the lower socket 20 from an inlet at the rear portion having the width W, the front portion of the express card is not stable at the inlet in the width direction. A guide 21A is formed on a lower surface of the upper plate portion 21 as a protrusion, and is inclined inwardly toward a front side from one of the side plate portions 22 at a left side. Accordingly, when the express card is inserted further from the inlet, the front portion of the card is guided with the guide 21B and moves to a position corresponding to the width W1.

As described above, the front portion of the lower socket 20 does not have a symmetrical shape in a plane view due to the cut portion 21A. The rear portion of the lower socket 20 has a symmetrical shape at least relative to the side plate portions 22. Opening portions 25A, 25B, and 25C, and engaging prices 26A, 26B, and 26C are formed in transition portions between the upper plate portion 21 and the side plate portions 22 of the lower socket 20 in a symmetrical manner. Further, opening portions 27A, 27B, and 27C, and engaging prices 28A, 28B, and 28C are formed in transition portions between the side plate portions 22 and the lower edge portions 23 of the lower socket 20 in a symmetrical manner. The opening portions 25A to 25C and 27A to 27C, and the engaging prices 26A to 26C and 28A to 28C have shapes same as those of the opening portions 15A to 15C and 17A to 17C, and the engaging prices 16A to 16C and 18A to 18C.

Note that the lower socket 20 does not have a portion corresponding to the guide portions 14A, 14b, 14C, and 14D of the upper socket 10. Similar to the upper socket 10, spring portions 29A and 29B are formed in the side plate portions 22 of the lower socket 20 as partial cut portions extending in the arrow direction B for urging a side portion of a card. As described above, the upper socket 10 and the lower socket 20 have the opening portions and the engaging pieces in the side plate portions in a symmetrical manner. Accordingly, it is possible to attach two types of the fixing members (described later) to either side of the upper socket 10 and the lower socket 20.

The upper socket 10 and the lower socket 20 are integrally held with fixing members 30 and 40 at the side plate portions 12 and 22. The fixing member 30 to be attached to the side plate portions 12 and 22 of the upper socket 10 and the lower socket 20 is formed of a metal plate. The fixing member 30 is provided with a holding portion 31 facing the side plate portions 12 and 22, and a fixing portion 37 extending from the holding portion 31 in the right angle. The holding portion 31 has upper and lower edge and an intermediate portion bent inwardly or bent inwardly with cut portions. Holding pieces 32, 33, 34, and 35 are disposed at edges of the upper and lower edge portions and the intermediate portion at four positions in a vertical direction.

The holding piece 32 is disposed at an uppermost first position, and includes three prices (32A, 32B, and 32C) along the arrow direction A. The holding piece 33 is disposed at a second position in a middle portion of the arrow direction A. The holding piece 34 is disposed at a third position slightly lower than the second position, and includes three prices (34A, 34B, and 34C) along the arrow direction A. The holding piece 35 is disposed at a lowermost fourth position, and includes three prices (35A, 35B, and 35C) along the arrow direction A.

The holding prices 32A, 32B, and 32C are located to correspond to the opening portions 15A, 15B, and 15C of the upper socket 10, respectively. The holding piece 33 is located to correspond to the opening portion 17A of the upper socket 10. The holding prices 34A, 34B, and 34C are located to correspond to the opening portions 25A, 25B, and 25C of the lower socket 20, respectively. The holding prices 35A, 35B, and 35C are located to correspond to the opening portions 27A, 27B, and 27C of the lower socket 20, respectively.

In the fixing member 30, the holding pieces 32A to 32C, 33, 34A to 34C, and 35A to 35C are provided with engaging grooves. For example, the holding piece 32A is provided with an engaging groove 36A in a slit shape opening toward a side opposite to a direction that a card is inserted. The engaging groove 36A receives the engaging piece 16A disposed adjacent to the opening portion 15A corresponding to the holding piece 32A. Other holding pieces other than the holding piece 32A are provided with similar grooves for receiving corresponding engaging pieces.

Figure 4:
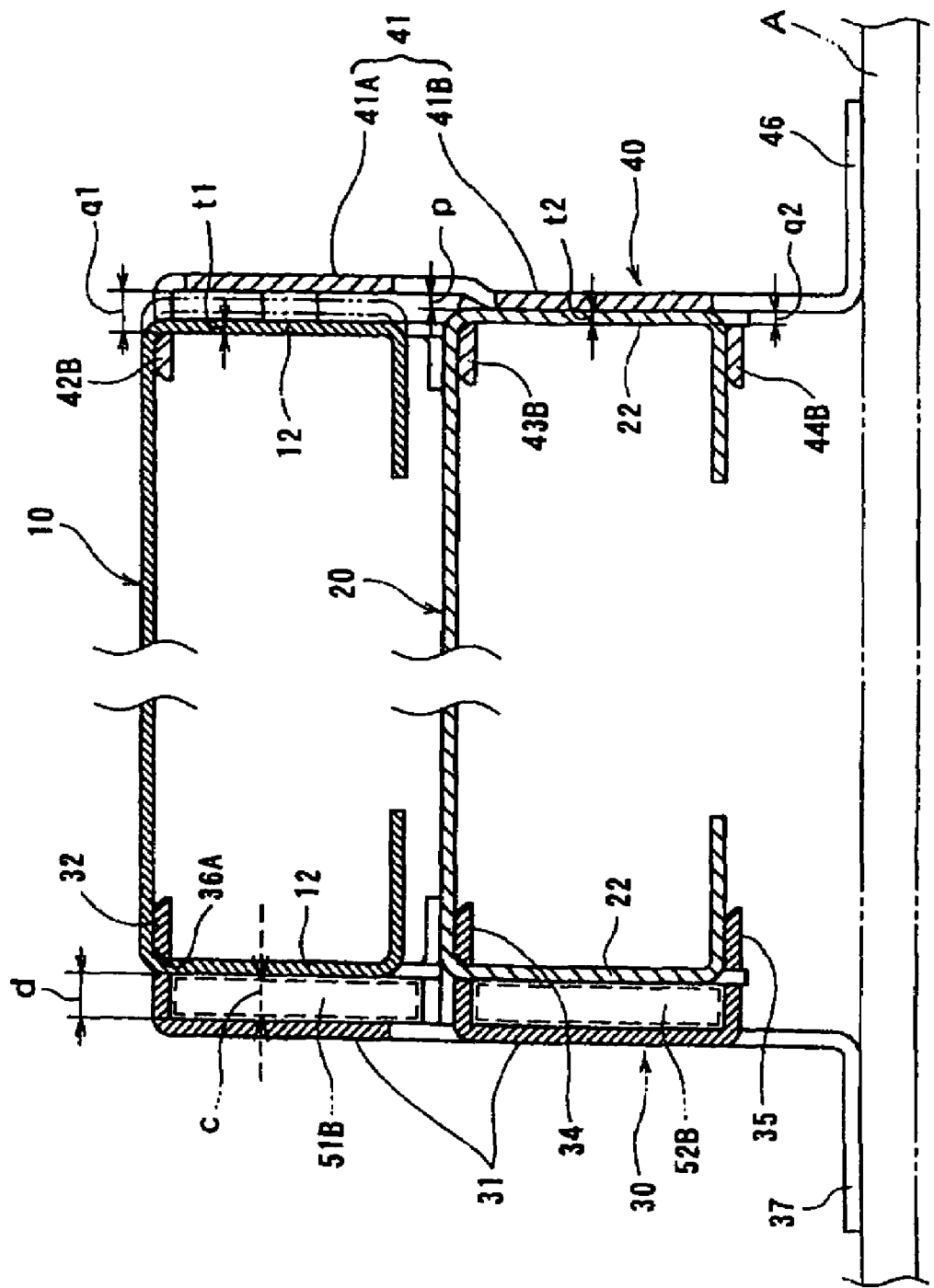
FIG. 4 is a sectional view showing the card socket assembly shown in FIG. 1 in an assembled state.

As shown in FIG. 4, the engaging groove 36A is away from a base surface (plate surface) of the holding portion 31 by a distance d. The distance d is slightly larger than a plate thickness c of a push rod (described later).

As described above, the fixing member 30 has the holding portion 31 having the holding pieces 32 to 35, and the fixing portion 37 extending from the holding portion 31 in the right angle. The fixing portion 37 is provided for fixing the fixing member 30 to a circuit board.

Figure 2:
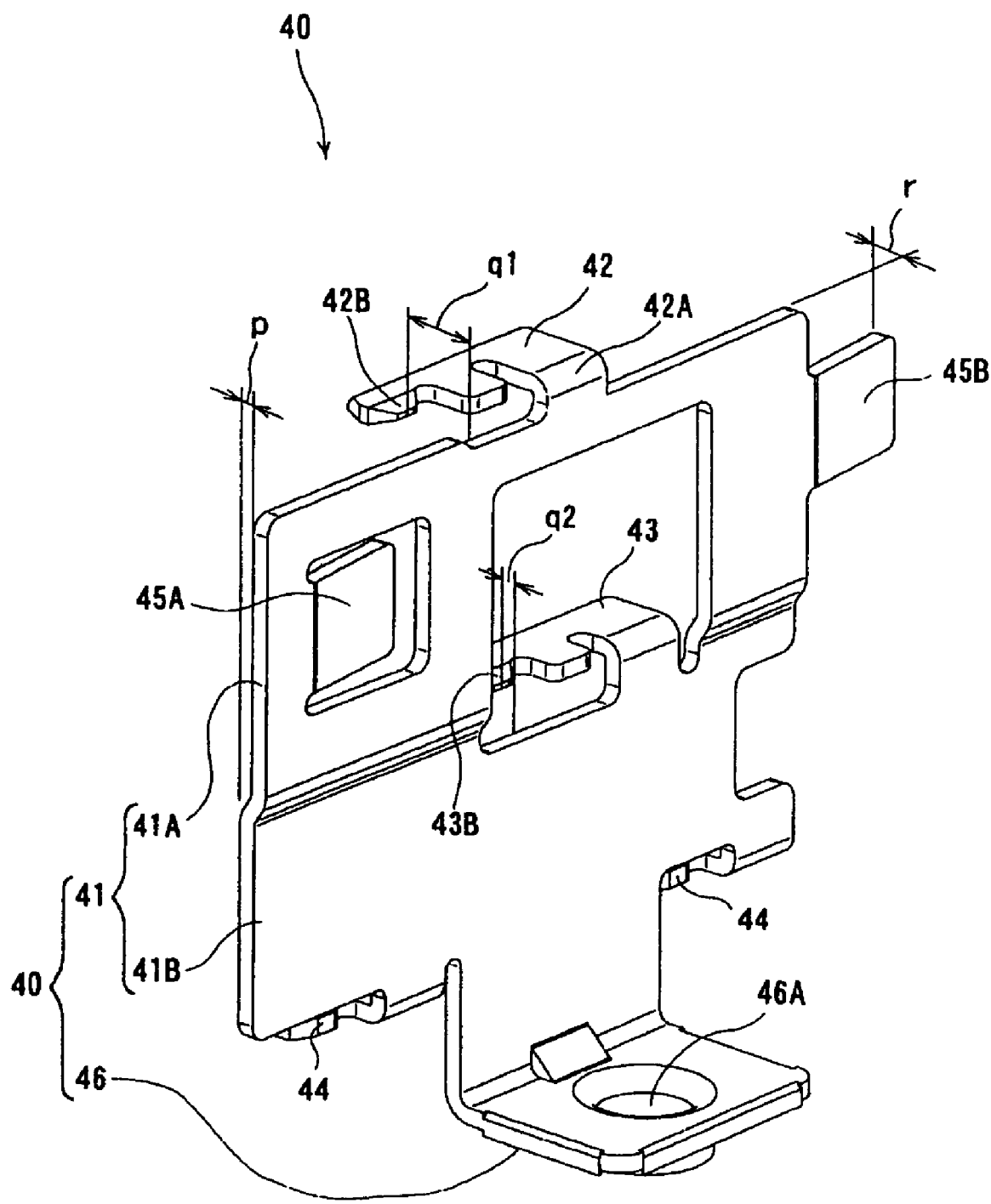
FIG. 2 is an enlarged perspective view showing one of fixing members.

As shown in FIG. 2, the fixing member 40 to be attached to the side plate portions 12 and 22 of the upper socket 10 and the lower socket 20 at the right side is formed of a metal plate. The fixing member 40 is provided with a holding portion 41 facing the side plate portions 12 and 22, and a fixing portion 46 extending from the holding portion 31 in the right angle.

The holding portion 41 has an upper holding portion 41A at a position corresponding to the side plate portion 12 of the upper socket 10, and a lower holding portion 41B at a position corresponding to the side plate portion 22 of the lower socket 20. The upper holding portion 41A has a plate surface as a base surface shifted from that of the lower holding portion 41B by a distance p in a plate thickness direction.

As shown in FIGS. 2 and 4, the holding portion 41 is provided with holding pieces 42, 43, and 44 at three positions, i.e., an upper position, a middle position, and a lower position. The holding pieces 42, 43, and 44 have similar shapes with small differences in dimension.

The upper holding piece 42 is bent at an upper edge of the fixing member 40; the lower holding piece 44 is bent at a lower edge of the fixing member 40 at two positions; and the middle holding piece 43 is formed in a cut portion cut and bent in a window shape at an upper half portion of the holding portion 41. The holding pieces 42, 43, and 44 are situated to correspond to the opening portion 16A of the upper socket 10, the opening portion 25A of the lower socket 20, and the opening portions 27A of the lower socket 20, respectively.

As described above, the holding pieces 42, 43, and 44 have similar shapes with small differences in dimension. As shown in FIG. 2, the holding piece 42 extends horizontally from a connecting portion 42A bent in the right angle from the base surface or the plate surface of the upper holding portion 41A, and has a shape of letter E together with the connecting portion 42A in a plane view. An engaging protrusion 42B is formed at a left end of the holding piece 42 with the shape of letter E.

As shown in FIG. 4, it is arranged such that the protrusion 42B is away from the upper holding portion 41A by a distance q1 larger than a thickness t1 of the side plate portion 12 of the upper socket 10. Similar to the holding piece 42, the holding pieces 43 and 44 are provided with protrusions 43B and 44B. It is arranged such that the protrusions 43B and 44B are away from the lower holding portion 41B by a distance q2 substantially same as a thickness t2 of the side plate portion 22 of the lower socket 20.

Accordingly, the side plate portion 22 is sandwiched and held with the lower holding portion 41B and the protrusions 43B and 44B. If there is no dimensional variance, the side plate portion 12 of the upper socket 10 is supposed to be situated at a position same as that of the side plate portion 22 of the lower socket 20. In an actual case, since there is such a dimensional variance, the holding portion 41 is shifted to absorb such a variance. For example, when there is a positive variance (an actual size is larger than a standard size), it is preferred that the holding portion 41 is shifted outwardly by p. When there is a negative variance p (an actual size is smaller than a standard size), it is preferred that the protrusion 42B is shifted inwardly from the lower holding portion 41B (q1=2p+t1).

The upper holding portion 41A of the fixing member 40 is provided with leaf spring portions 45A and 45B as elastic holding members cut upwardly and extending forward. The leaf spring portions 45A and 45B have distal end portions inclined and protruding by a distance r (see FIG. 2) toward the side plate portion 12 of the upper socket 10. In an unassembled state, when there is the positive variance, the distance r becomes slightly smaller than a distance of the distance p subtracted by the thickness t1 of the upper socket 10 (r>p−t1). When there is a negative variance, the distance r becomes slightly smaller than a distance of the distance q1 subtracted by the thickness t1 of the upper socket 10 (r>q1−t1).

As shown in FIG. 2, the fixing portion 46 of the fixing member 40 is bent in the right angle relative to the base surface of the holding portion 41, and is provided with a fixing hole 46A. A screw (not shown) can be inserted into the fixing hole 46A, so that the fixing portion 46 is fixed to a circuit board (not shown).

As described above, the fixing member 30 is away from the side plate portions 12 and 22 of the upper socket 10 and the lower socket 20 by the distance d to form a space. Plate rod portions 51B and 52B of push rods 51 and 52 with push button portions 51A and 52A are accommodated in the space. When cards inserted in the upper socket 10 and the lower socket 20 are taken out, the push rods 51 and 52 are pushed. That is, when an operator pushes the push button portions 51A and 52A of the push rods 51 and 52, the plate rod portions 51B and 52B operate a diving mechanism (not shown) to obtain a state that the cards can be taken out.

In the embodiment, the fixing members hold the both sockets and are fixed to a circuit board as follows. First, the upper socket 10 and the lower socket 20 are arranged in a stack, and attached to the fixing member 30. That is, in a state that the push rods 51 and 52 are held, the holding pieces 32 (32A, 32B, and 32C), 33, 34 (34A, 34B, and 34C), 35 (35A, 35B, and 35C) provided on the holding portion 31 of the fixing member 30 are inserted into the corresponding opening portions 15 (15A, 15B, and 15C), 17A, 25 (25A, 25B, and 25C), 27 (27A, 27B, and 27C) of the upper socket 10 and the lower socket 20 from a side of the sockets. Then, the fixing member 30 is moved in a direction opposite to the arrow directions A and B.

When the fixing member 30 is moved, the engaging pieces 16 (16A, 16B, and 16C), 18A, 26 (26A, 26B, and 26C), 27 (27A, 27B, and 27C) of the upper socket 10 and the lower socket 20 are pressed into the corresponding engaging grooves 36A and the likes provided in the holding pieces 32, 33, 34, and 35. When the fixing member 30 is attached to the upper socket 10 and the lower socket 20, the side plate portions 12 and 22 of the upper socket 10 and the lower socket 20 are fixed and held. At this time, the plate surface of the holding portion 31 of the fixing member 30 is automatically situated away from the engaging pieces 16 and the likes, i.e., the side plate portions 12 and 22 of the upper socket 10 and the lower socket 20, by a specific distance. Accordingly, the rod portions 51B and 52B of the push rods 51 and 52 accommodated in the space are not pressed against the fixing members and the sockets, so that the push rods 51 and 52 can move smoothly.

Then, the fixing member 40 is attached to the side plate portions 12 and 22 of the upper socket 10 and the lower socket 20. That is, the holding piece 42 provided on the upper holding portion 41 of the holding portion 41 of the fixing member 40, and the holding pieces 43 and 44 provided on the lower holding portion 41B are inserted into the corresponding opening portions 15A, 25A, and 27A of the upper socket 10 and the lower socket 20 from a side of the sockets. Then, the fixing member 40 is moved in a direction opposite to the arrow directions A and B.

When the fixing member 40 is moved, the protrusions 43B and 44B provided on the holding pieces 43 and 44 of the lower holding portion 41B are pressed against an inner surface of the side plate portion 22 of the lower socket 20. Accordingly, the lower holding portion 41B firmly holds the side plate portion with the protrusions 43B and 44B. That is, the lower socket 20 is firmly held with the fixing member 40.

The protrusion 42B provided on the holding piece 42 of the upper holding portion 41A elastically holds the side plate portion 12 of the upper socket 10 together with the leaf spring portions 45A and 45B. That is, the leaf spring portions 45A and 45B function as spring members, and the protrusion 42B functions as a regulation member. Accordingly, the fixing member 40 fixedly holds the lower socket 20 and elastically holds the upper socket 10. Even when the lower socket 20 has a dimensional variance in the width direction relative to the upper socket 10, it is possible to absorb the variance due to the elastic holding. For example, in FIG. 4, when there is a variance in the width direction toward outside as indicated by a phantom line, it is possible to absorb the variance. Note that, as shown in FIG. 3, a stopper piece 15S extends sideways from the upper plate portion 21 and is slightly bent downwardly, so that the holding piece 42 does not come off the opening portion 15A.

Afterwards, the fixing portions 37 and 47 of the fixing members 30 and 40 are firmly fixed to a circuit board A with screws and the likes. At this time, if the fixing portion is not arranged with the exact right angle relative to the holding portion, an excessive stress might be generated between the fixing member and the socket when the fixing member is attached to the circuit board. In the embodiment, since the fixing member 40 elastically holds the upper socket 10, it is possible to prevent an excessive stress in the fixing member or the socket.

The present invention is not limited to the embodiment described above, and various modifications are possible. For example, it is possible to hold more than three sockets with the fixing members. In this case, one of the fixing members fixedly holds one of the sockets, and elastically and separately holds the others of the sockets with the elastic holding member. Further, the other of the fixing members may have an elastic holding member having a base surface shifted inwardly relative to the base surface of the holding member. When a plurality of sockets has dimensional variances in the width direction, the elastic holding member may be shifted to reduce the variance. The elastic holding member is not limited to the leaf spring portion formed as a part of the fixing member, and may be formed as a separate member to be attached to the fixing member.

The disclosure of Japanese Patent Application No. 2005-135844, filed on May 9, 2005, is incorporated in the application.

While the invention has been explained with reference to the specific embodiments of the invention, the explanation is illustrative and the invention is limited only by the appended claims.

What is claimed is:

1. A card socket assembly comprising:
    at least two sockets for receiving cards;
    a first fixing member disposed at one side of the sockets for fixing the sockets to a circuit board, said first fixing member having a first fixing portion to be fixed to the circuit board and a first holding portion for holding the sockets, said first holding portion having a first holding member for fixedly holding all of the sockets; and
    a second fixing member disposed at the other side of the sockets for fixing the sockets to the circuit board, said second fixing member having a second fixing portion extending outwardly from a bottom end thereof to be fixed to the circuit board and a second holding portion for holding the sockets, said second holding portion having an upper holding portion and a lower holding portion extending inwardly from the upper holding portion, said second holding portion having a second holding member for fixedly holding one of the sockets and an elastic holding member disposed inwardly in the upper holding portion for elastically holding the other of the sockets.

2. The card socket assembly according to claim 1, wherein said elastic holding member holds the other of the sockets separately.

3. The card socket assembly according to claim 1, wherein at least one of said first fixing member and said second fixing member has an L-shape cross section.

4. The card socket assembly according to claim 1, further comprising a regulation member for regulating a position of the other of the sockets in a direction that the other of the sockets is urged.

5. The card socket assembly according to one of claim 1, wherein said elastic holding member includes a distal end portion protruding inward.

6. The card socket assembly according to claim 5, wherein said distal end portion is situated inward relative to the lower holding portion.

7. The card socket assembly according to claim 1, wherein said upper holding portion is shifted away from a side surface of the other of the sockets.

8. The card socket assembly according to claim 1, wherein at least one of said first fixing member and said second fixing member is arranged such that the one of the first fixing member and the second fixing member is situated away from the sockets to form a space therebetween for accommodating a rod member.

* * * * *